United States Patent
Chao et al.

(10) Patent No.: US 8,796,808 B2
(45) Date of Patent: *Aug. 5, 2014

(54) MOS P-N JUNCTION SCHOTTKY DIODE DEVICE AND METHOD FOR MANUFACTURING THE SAME

(75) Inventors: Kuo-Liang Chao, Taipei (TW); Hung-Hsin Kuo, Taipei (TW); Tse-Chuan Su, Taipei (TW)

(73) Assignee: PFC Device Corp., Taipei (TW)

(*) Notice: Subject to any disclaimer, the term of this patent is extended or adjusted under 35 U.S.C. 154(b) by 451 days.

This patent is subject to a terminal disclaimer.

(21) Appl. No.: 12/427,256

(22) Filed: Apr. 21, 2009

(65) Prior Publication Data
US 2009/0261428 A1    Oct. 22, 2009

(30) Foreign Application Priority Data
Apr. 22, 2008   (TW) .............................. 97114729 A

(51) Int. Cl.
*H01L 29/47*   (2006.01)

(52) U.S. Cl.
USPC ........... 257/471; 257/473; 257/475; 257/478; 438/570; 438/571; 438/575; 438/580; 438/582

(58) Field of Classification Search
USPC .......... 257/471, 473, 475, 478; 438/570, 571, 438/575, 580, 582
See application file for complete search history.

(56) References Cited

U.S. PATENT DOCUMENTS

| | | | | |
|---|---|---|---|---|
| 4,811,065 A * | 3/1989 | Cogan | ............................ | 257/328 |
| 4,823,172 A * | 4/1989 | Mihara | ......................... | 257/144 |
| 5,268,586 A * | 12/1993 | Mukherjee et al. | ........... | 257/335 |
| 5,365,102 A | 11/1994 | Mehrotra et al. | | |
| 5,886,383 A * | 3/1999 | Kinzer | ............................ | 257/341 |
| 5,915,179 A * | 6/1999 | Etou et al. | ..................... | 438/268 |
| 6,078,090 A * | 6/2000 | Williams et al. | .............. | 257/476 |
| 6,133,107 A * | 10/2000 | Menegoli | ...................... | 438/306 |
| 6,331,455 B1 * | 12/2001 | Rodov et al. | .................. | 438/138 |
| 6,498,367 B1 * | 12/2002 | Chang et al. | .................. | 257/341 |
| 6,537,860 B2 * | 3/2003 | Akiyama et al. | .............. | 438/135 |
| 6,686,614 B2 * | 2/2004 | Tihanyi | ......................... | 257/155 |
| 6,724,039 B1 * | 4/2004 | Blanchard | ..................... | 257/328 |
| 6,765,264 B1 * | 7/2004 | Chang et al. | .................. | 257/336 |
| 2005/0199918 A1 * | 9/2005 | Calafut et al. | ................. | 257/260 |
| 2008/0029812 A1 * | 2/2008 | Bhalla | ............................ | 257/330 |
| 2009/0261427 A1 * | 10/2009 | Chao et al. | ..................... | 257/409 |

* cited by examiner

*Primary Examiner* — Lex Malsawma
*Assistant Examiner* — Eric Jones
(74) *Attorney, Agent, or Firm* — WPAT, PC; Justin King

(57) ABSTRACT

A MOS P-N junction Schottky diode device includes a substrate having a first conductivity type, a field oxide structure defining a trench structure, a gate structure formed in the trench structure and a doped region having a second conductivity type adjacent to the gate structure in the substrate. An ohmic contact and a Schottky contact are formed at different sides of the gate structure. The method for manufacturing such diode device includes several ion-implanting steps to form several doped sub-regions with different implantation depths to constitute the doped regions. The formed MOS P-N junction Schottky diode device has low forward voltage drop, low reverse leakage current, fast reverse recovery time and high reverse voltage tolerance.

15 Claims, 7 Drawing Sheets

MOS P-N JUNCTION SCHOTTKY DIODE DEVICE AND METHOD FOR MANUFACTURING THE SAME

FIELD OF THE INVENTION

The present invention relates to a metal-oxide-semiconductor (MOS) P-N junction Schottky diode device and a method for manufacturing the diode device, and more particularly to a MOS P-N junction Schottky diode device with low leakage current, low forward voltage drop, high reverse voltage and fast reverse recovery time.

BACKGROUND OF THE INVENTION

A Schottky diode is a unipolar device using electrons as carriers, which is characterized by high switching speed and low forward voltage drop. Hence, Schottky diodes are used in many applications. The limitations of Schottky diodes are the relatively low reverse voltage tolerance and the relatively high reverse leakage current. The limitations are related to the Schottky barrier determined by the metal work function of the metal electrode, the band gap of the intrinsic semiconductor, the type and concentration of dopants in the semiconductor layer, and other factors. In contrast to the Schottky diode, a P-N junction diode is a bipolar device that can pass more current than the Schottky diode. However, the P-N junction diode has a forward voltage drop higher than that of the Schottky diode, and takes longer reverse recovery time due to a slow and random recombination of electrons and holes during the recovery period.

A typical device of Schottky diode device with MOS trench has been disclosed by U.S. Pat. No. 5,365,102. Please refer to FIGS. 1A-1F illustrating the manufacturing method of forming the trench MOS barrier Schottky rectifier (TMBSR). Firstly, a substrate 11 with an N-type epitaxial layer 12 grown thereon is provided. Then, a multilayered stack of a pad oxide layer 13, a mask nitride layer 15 and a photo-resist layer 17 is formed on the N-type epitaxial layer 12. The pad oxide layer 13 may relieve interlayer stress between the N-type epitaxial layer 12 and the mask nitride layer 15 (FIG. 1A). A photolithography and etching step is performed to partially remove the mask nitride layer 15, the pad oxide layer 13 and the N-type epitaxial layer 12 so as to form discrete mesas 14 and trenches 20 defined between the mesas 14 (FIG. 1B). A thermal oxide layer 16 is then formed on the trench bottoms and trench sidewalls (FIG. 1C). After the remaining portions of the mask nitride layer 15 and the pad oxide layer 13 are removed (FIG. 1D), an anode metal layer 18 is subsequently plated thereon (FIG. 1E). The anode metal layer 18 is then subjected to a metal patterning step, wherein a Schottky barrier contact is formed on the interface between the anode metal layer 18 and the mesa 14 of the N-type epitaxial layer 12. At last, a backside grinding step is conducted on the backside of the wafer and a cathode electrode 19 is formed thereon (FIG. 1F). The process of manufacturing the TMBSR is thus basically completed.

The TMBSR made by the aforementioned method has a low forward voltage drop but a high reverse leakage current. If a lower reverse-biased leakage current is desired, one solution is to choose a metal electrode with a higher work function to reduce the reverse leakage current. However, in this context the forward voltage drop of the TMBSR is increased. Accordingly, there is a trade-off between the forward voltage drop and the reverse leakage current.

An alternative way in reducing the reverse leakage current is to deepen the trenches so as to increase the length of the pitch-off channel to inhibit the reverse leakage current. Nevertheless, such device cannot resist high reverse voltage, unless the thickness of the N-type epitaxial layer 12 is increased to improve the reverse voltage tolerance. In conclusion, Schottky diode is not suitable for high power application. Current commercial Schottky diode device has a reverse voltage tolerance less than 600 V. In fact, so-called 600 V Schottky diode device consists of two TMBSRs connected in series and each has a reverse voltage tolerance of 300 V, which leads to a higher forward voltage drop. Thus, it is a challenge to design a diode device with high reverse voltage tolerance (e.g. higher than 600 V), low forward voltage drop, low reverse leakage current and fast reverse recovery time. Therefore, there is a need of providing a diode device with these properties to obviate the drawbacks encountered from the prior art. Furthermore, a cost-effective method for manufacturing such diode device is also desired.

SUMMARY OF THE INVENTION

The present invention provides a MOS P-N junction Schottky diode device combining a Schottky diode, an n-channel MOS structure and a P-N junction diode to achieve better performance involving low reverse leakage current, low forward voltage drop, high reverse voltage and fast reverse recovery time.

The present invention also provides a convenient and cost-effective method for manufacturing the MOS P-N junction Schottky diode device. Fewer masks are required for this manufacturing method.

In accordance with an aspect of the present invention, the MOS P-N junction Schottky diode device includes a substrate, a field oxide structure, a gate structure, a doped region, a top electrode and a bottom electrode. The top electrode and the bottom electrode are formed at opposite sides of the substrate. The doped region has different conductivity type from the substrate. Besides, an ohmic contact is formed between the doped region and the top electrode at one side of the gate structure while a Schottky contact is formed between the substrate and the top electrode at the other side of the gate structure. The field oxide structure defines a trench structure in which the gate structure is formed. The doped region has a plurality of adjacent doped sub-regions with different implantation depths and extends from a surface of the substrate. Hence, a MOS structure, a P-N junction diode and a Schottky diode are provided in the diode device.

In accordance with another aspect of the present invention, a first mask layer having an opening, formed by a first photolithography step and an etching step, is formed on a substrate and a first ion-implanting step is performed through the opening to form a guard ring in the substrate. Then, a second photolithography step and an oxide wet etching step are performed and a portion of the first mask layer is removed to form a field oxide structure defining a trench structure. A conductive semiconductor layer, a second mask layer and a photo-resist layer, patterned by a third photolithography step and defining the conductive semiconductor layer, are formed in the trench structure wherein the remaining second mask layer formed by an isotropic etching step is shorter than the patterned photo-resist layer. A second ion-implanting step and a third ion-implanting step are performed by using the patterned photo-resist layer and the remaining second mask layer as masks, respectively, to form adjacent doped sub-regions with different implantation depths. A fourth photolithography and etching step is formed to remove the second mask layer and partially remove the conductive semiconductor layer to form a gate structure. At last, a top electrode and a bottom electrode are disposed at opposite sides of the substrate.

BRIEF DESCRIPTION OF THE DRAWINGS

The above objects and advantages of the present invention will become more readily apparent to those ordinarily skilled in the art after reviewing the following detailed description and the accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
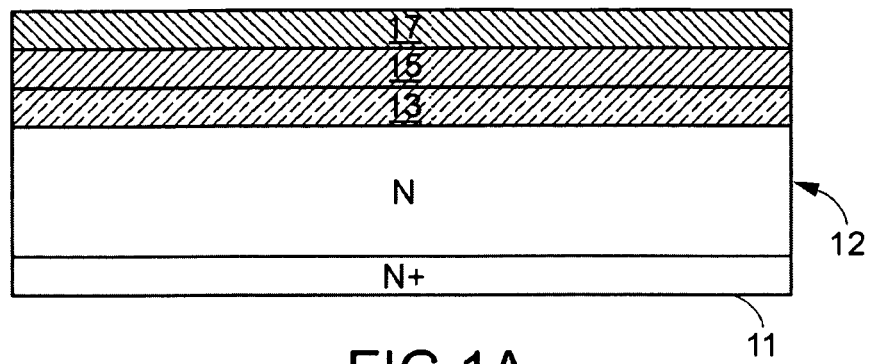
FIGS. 1A-1F schematically illustrate the manufacturing method of forming the known trench MOS barrier Schottky rectifier.
Figure 1B:
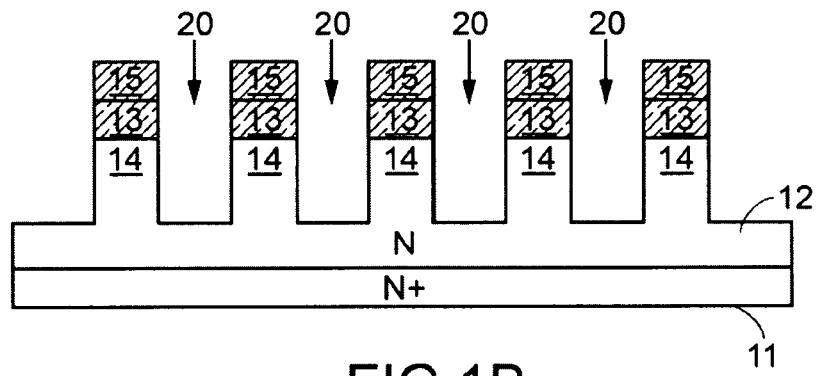
Figure 1C:
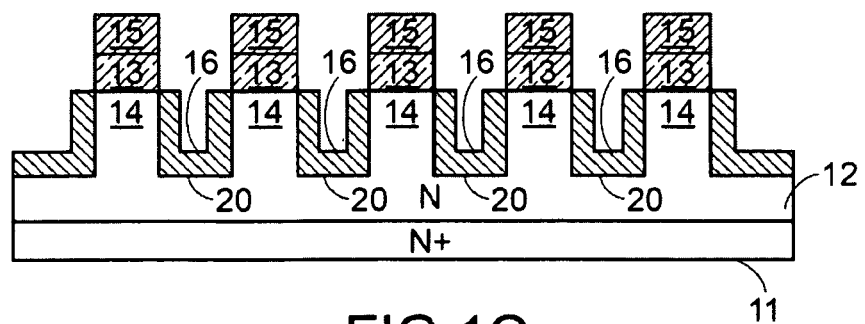
Figure 1D:
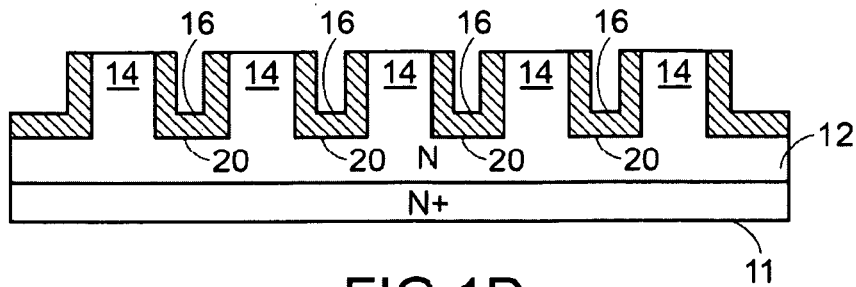
Figure 1E:
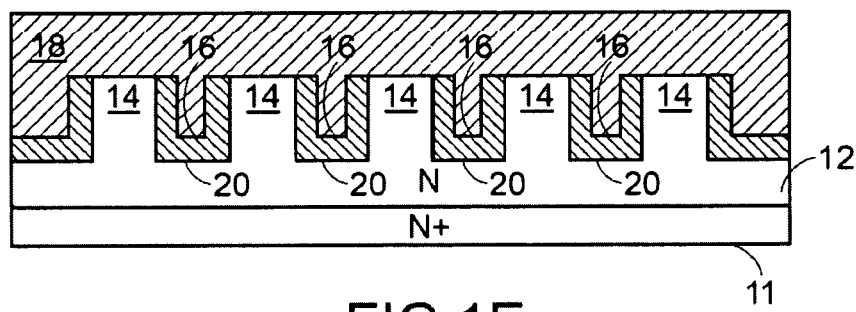
Figure 1F:
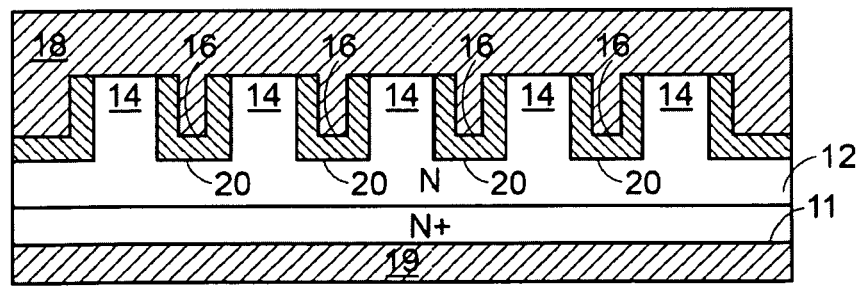
Figure 2:
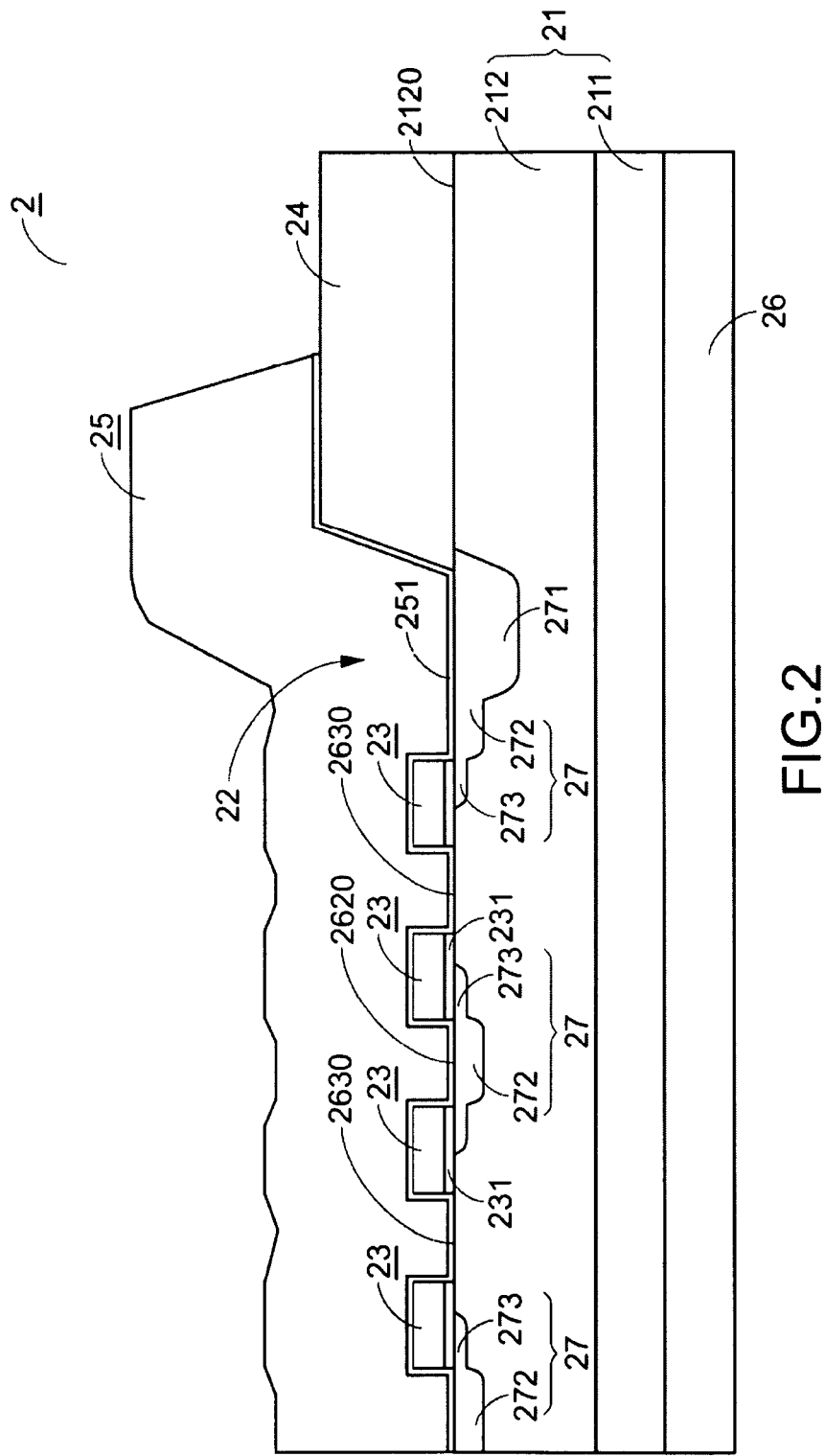
FIG. 2 is a cross-sectional view illustrating a preferred embodiment of a MOS P-N junction Schottky diode device according to the present invention.

Referring to FIG. 2, FIG. 2 schematically illustrates a preferred embodiment of a MOS P-N junction Schottky diode device according to the present invention. Please note that the article "a" or "an" may be used for some elements, but the number of the elements is not limited to "one". The amount may vary with different applications. As shown in FIG. 2, the MOS P-N junction Schottky diode device 2 primarily includes a substrate 21, a trench structure 22, a gate structure 23, a field oxide structure 24, a top electrode 25, a bottom electrode 26 and a doped region 27. The substrate 21 includes a heavily-doped N-type silicon layer 211 and a lightly-doped N-type epitaxial layer 212. The field oxide structure 24 is formed on the substrate 21 and defines the trench structure 22. The gate structure 23 is formed in the trench structure 22 on the N-type epitaxial layer 212 wherein a gate oxide layer 231 is interfaced between the gate structure 23 and the substrate 21. The top electrode 25 covers the trench structure 22, the gate structure 23 and the field oxide structure 24, while the bottom electrode 26 is formed on the opposite surface of the substrate 21. Both the top electrode 25 and the bottom electrode 26 are made of metal material, for example Al, Al alloy or other suitable metal material. An adhesion layer 251 made of Ti or TiN may be provided between the top electrode 25 and the substrate 21 to enhance the bonding of the top electrode 25 to the substrate 21.

There are two kinds of contacts established at different sides of the gate structure 23. Ohmic contact 2620 is formed on the interface between the top electrode 25 and the doped region 27. On the other hand, Schottky contact 2630 is formed on the interface between the top electrode 25 and an undoped portion of the N-type epitaxial layer 212.

In this embodiment, the doped region 27 includes a first doped sub-region 272 and a second doped sub-region 273 with different implantation depths. The first doped sub-region 272 is deeper than the second doped sub-region 273. A guard ring 271 may be formed in the edge of the MOS P-N junction Schottky diode device to define the device region. The first doped sub-region 272, the second doped sub-region 273 and the guard ring 271 are implanted with P-type dopants. Both of the doped sub-regions 272 and 273 extend from the surface 2120 of the lightly-doped N-type epitaxial layer 212. It means that no other N doped region will be formed between the doped region 27 and the surface 2120 of the lightly-doped N-type epitaxial layer 212. The p-type doped sub-regions 272 and 273 together with the lightly-doped N-type epitaxial layer 212 provide a P-N junction adjacent to the n-channel MOS structure including the gate structure 23, the gate oxide layer 231 and the substrate 21. At the other side of the n-channel MOS structure, the top electrode 25 together with the lightly-doped N-type epitaxial layer 212 provides a Schottky diode.

According to the present invention, the MOS P-N junction Schottky diode device 2 integrates an n-channel MOS structure with a P-N junction diode and a Schottky diode. By virtue of this structure design, when the MOS P-N junction Schottky diode device 2 is forward-biased, the n-channel MOS structure, the P-N junction diode, the Schottky diode are operated as parallel connection. Hence, the MOS P-N junction Schottky diode device 2 keeps the advantages of the Schottky diode such as low forward voltage drop and high switching speed. When the MOS P-N junction Schottky diode device 2 is reverse-biased, a depletion region is formed in the P-N junction diode and almost no net current flows through the junction. With the increasing reverse voltage, the depletion regions at two sides of the Schottky diode extend to pitch off the channel under the Schottky contact 2630 and the n-channel MOS structure to inhibit the leakage current. Hence, the MOS P-N junction Schottky diode device 2 can withstand high reverse voltage and decrease leakage current. Therefore, the MOS P-N junction Schottky diode device 2 has the advantage over Schottky diode in reverse mode. Because of these advantages, the MOS P-N junction Schottky diode device 2 provides much better performance than the conventional Schottky diode and P-N junction diode.

Figure 3A:
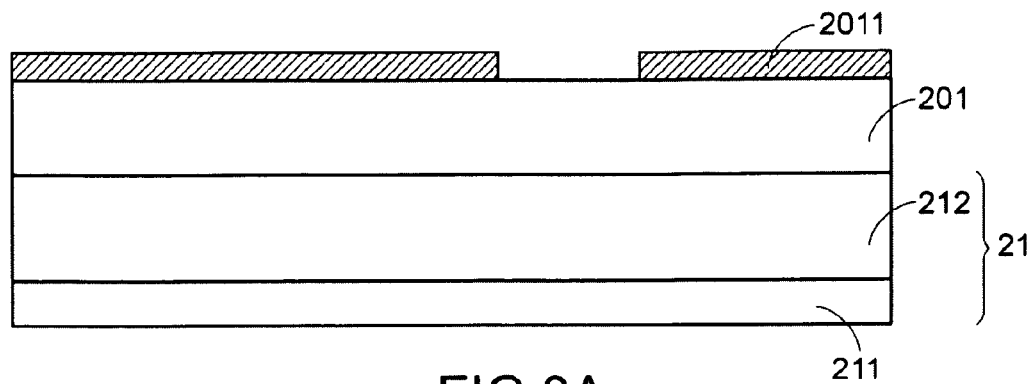
FIGS. 3A-3J schematically illustrate the manufacturing method for forming the MOS P-N junction Schottky diode device of FIG. 2.

FIGS. 3A-3J illustrate the manufacturing method for forming the MOS P-N junction Schottky diode of FIG. 2 according to the present invention. As shown in FIG. 3A, a stack structure including a substrate 21, a mask oxide layer 201 and a first patterned photo-resist layer 2011 is formed. The substrate 21 includes a heavily-doped N-type silicon layer 211 and a lightly-doped N-type epitaxial layer 212. The mask oxide layer 201 is grown by thermal oxidation or deposited on the substrate 21.

Figure 3B:
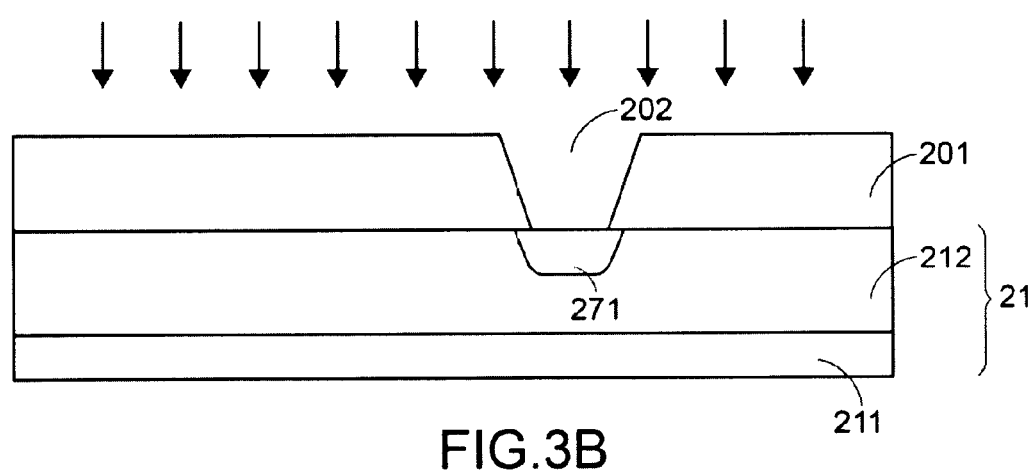

In FIG. 3B, the mask oxide layer 201 is subjected to an etching step to partially remove the mask oxide layer 201 to expose a portion of the lightly-doped N-type epitaxial layer 212. After removing the first patterned photo-resist layer 2011, a P-type dopant such as B ion or $BF_2$ is then implanted through the opening 202 of the mask oxide layer 201. It is noted that the P-type dopant can be implanted before or after the removal of the photo-resist layer 2011. A thermal drive-in step is introduced to form the deep guard ring 271 which defines the device region in the lightly-doped N-type epitaxial layer 212.

Figure 3C:
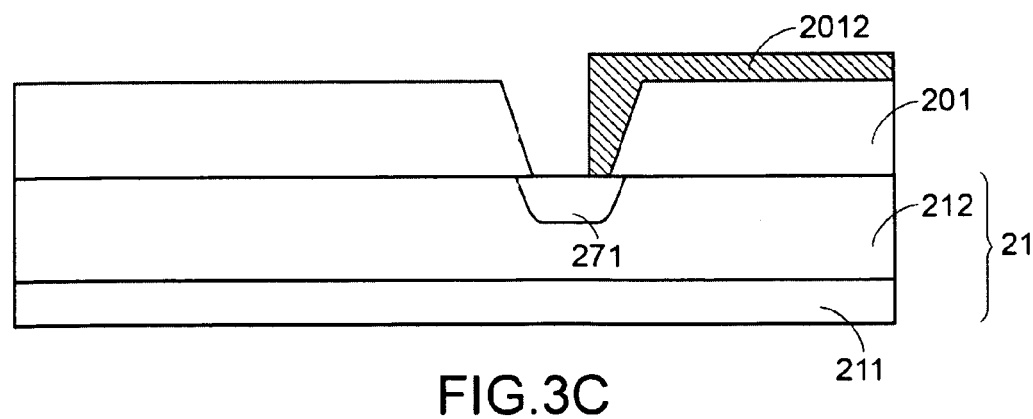
Figure 3D:
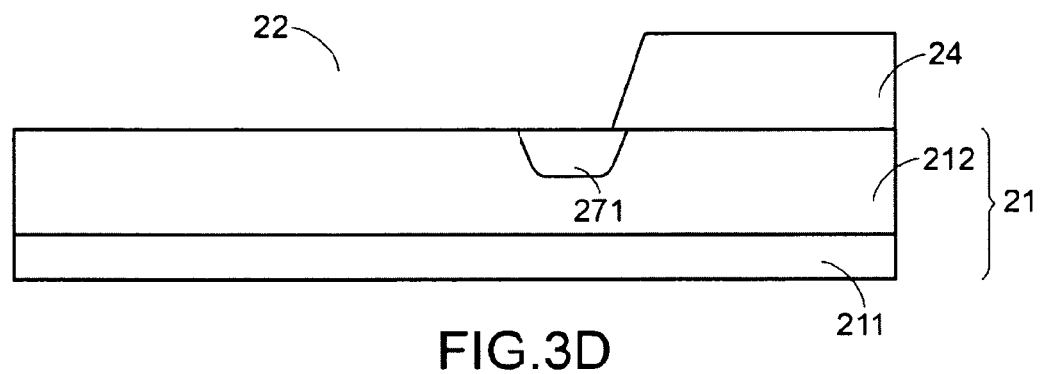

In FIG. 3C, a second patterned photo-resist layer 2012 is formed on a portion of the mask oxide layer 201, which will form the field oxide structure 24 later. Then, an etching procedure is performed to remove the mask oxide layer 201 not covered by the second patterned photo-resist layer 2012. After removing the second patterned photo-resist layer 2012, the remaining mask oxide layer 201 is the field oxide structure 24 defining the trench structure 22 as shown in FIG. 3D.

Figure 3E:
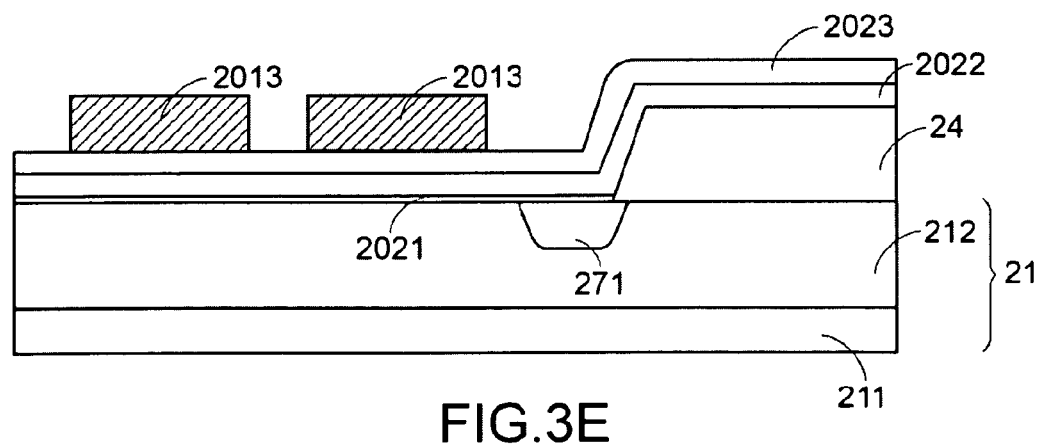

In FIG. 3E, an insulating layer 2021, a polysilicon layer 2022 and a mask oxide layer 2023 are sequentially formed on the lightly-doped N-type epitaxial layer 212 and the field oxide structure 24. The insulating layer 2021 is an oxide layer. The polysilicon layer 2022 may be a doped or undoped polysilicon layer deposited by chemical vapor deposition (CVD). The mask oxide layer 2023 is formed by thermal oxidation. Thereafter, a third patterned photo-resist layer 2013 used for defining the polysilicon layer 2022 is formed on the mask oxide layer 2023.

Figure 3F:
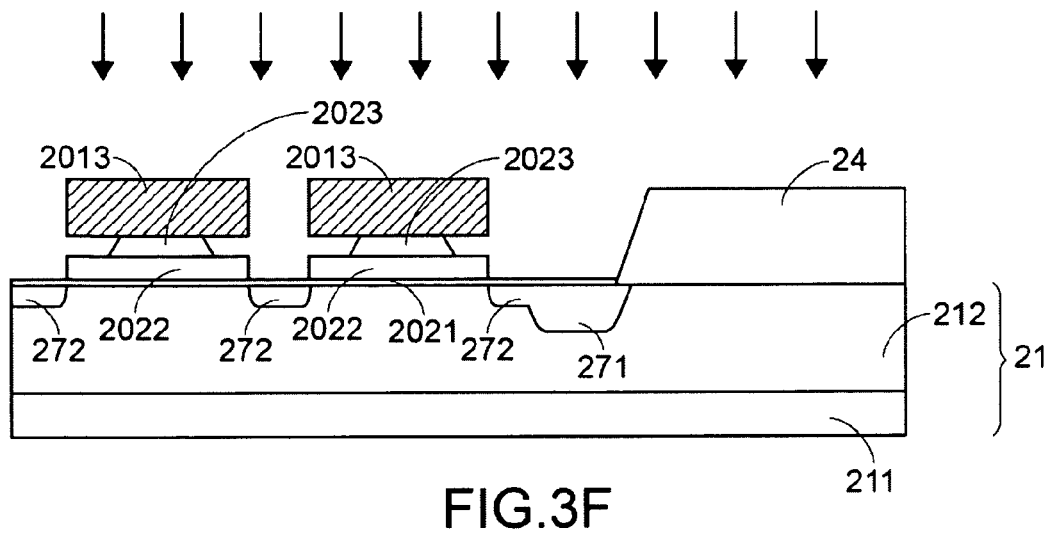

Then, an isotropic etching step (e.g. wet etching) and an anisotropic etching step (e.g. dry etching) are performed to partially remove the mask oxide layer 2023 and the polysilicon layer 2022, respectively. FIG. 3F shows that the remaining mask oxide layer 2023 is shorter than the remaining polysilicon layer 2022. A P-type dopant is further implanted into the lightly-doped N-type epitaxial layer 212 by using the third patterned photo-resist layer 2013 as a mask. Hence, the first doped sub-region 272 is formed adjacent to the remaining polysilicon layer 2022.

Figure 3G:
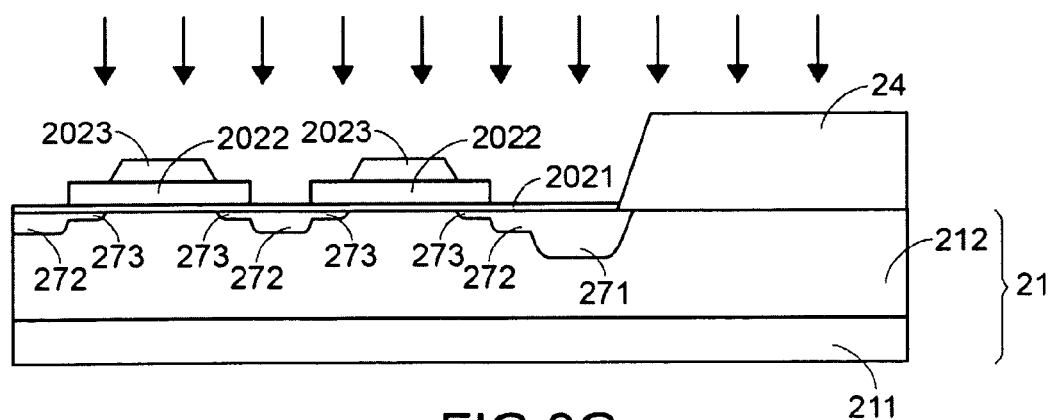

In FIG. 3G, the third patterned photo-resist layer 2013 is removed. A P-type dopant is further implanted into the lightly-doped N-type epitaxial layer 212 by using the mask oxide layer 2023 as a mask. Hence, the second doped sub-region 273 is formed under the polysilicon layer 2022 and adjacent to the first doped sub-region 272. The second doped sub-region 273 is shallower than the first doped sub-region 272. It is noted that a rapid thermal annealing (RTA) can be employed to activate all implants at this stage. Separate rapid thermal annealing can be preformed after each individual implanting step as an alternative approach.

Figure 3H:
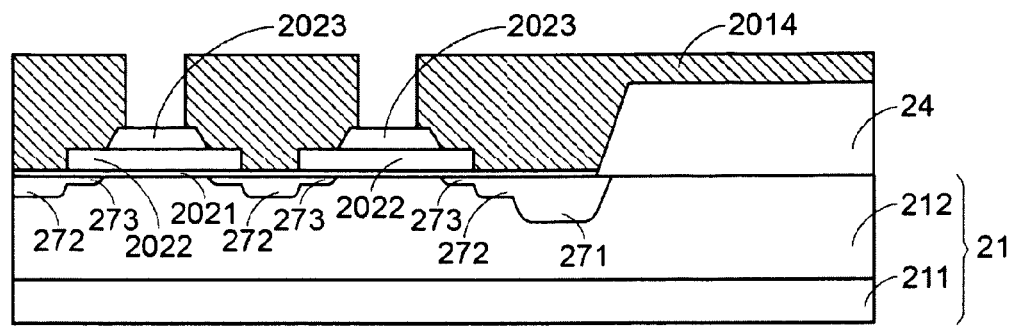
Figure 3I:
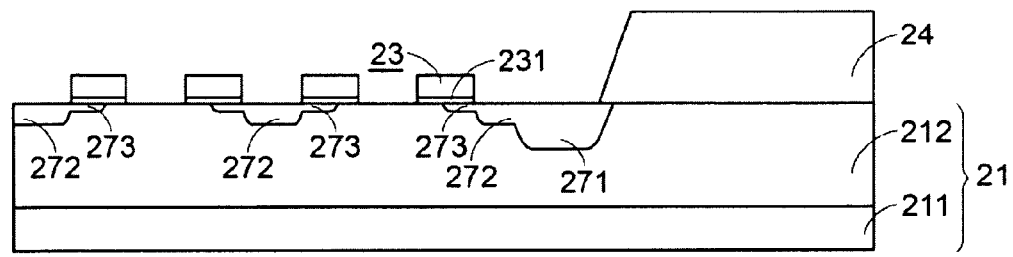

In FIG. 3H, the fourth patterned photo-resist layer 2014 is formed on the trench structure 22 and the filed oxide structure 24 while exposing a portion of the mask oxide layer 2023. Then, an isotropic etching step (e.g. wet etching) and an anisotropic etching step (e.g. dry etching) are performed to entirely remove the mask oxide layer 2023 and partially remove the polysilicon layer 2022, respectively. The remaining polysilicon layer 2022 is the gate structure 23 as shown in FIG. 3I. The fourth photo-resist layer 2014 is removed and an oxide wet dipping step is performed to remove the insulating layer 2021 not covered by the gate structure 23. The remaining insulating layer 2021 is the gate oxide layer 231 for isolating the gate structure 23 from the active region in the substrate 21.

Figure 3J:
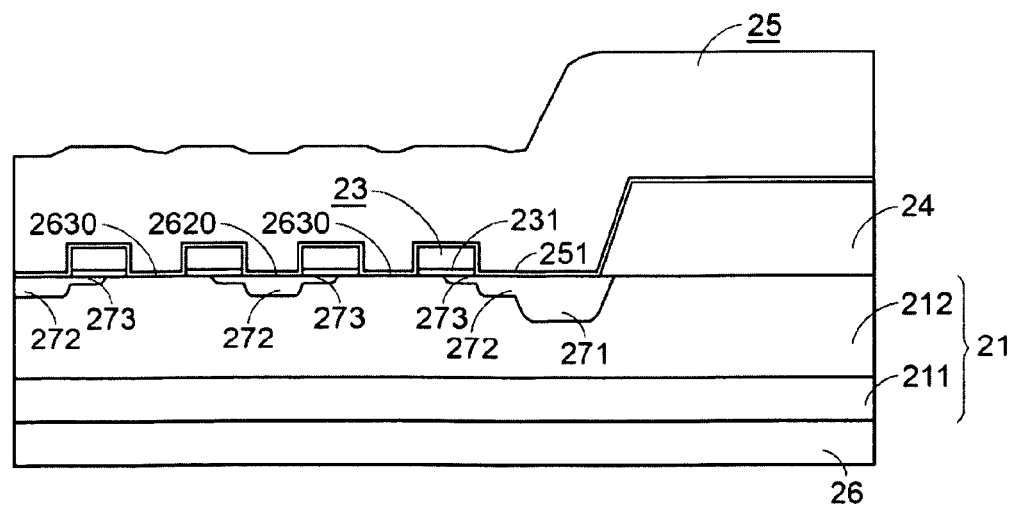

At last, the top electrode 25 and the bottom electrode 26 are formed at the opposite sides of the resulting structure, as shown in FIG. 3J. A metal material, for example Al, Al alloy or other suitable metal material, forms the electrodes 25 and 26 by sputtering and sintering. An adhesion layer 251 may be formed prior to the formation of the top electrode 25. The adhesion layer 251 is deposited by Ti or TiN sputtering and subjected to a rapid thermal nitridation to enhance the bonding effect. After these steps, the MOS P-N junction Schottky diode device 2 is obtained.

According to the present invention, the MOS P-N junction Schottky diode device has low forward voltage drop in the forward mode and has low reverse leakage current and high voltage tolerance in the reverse mode. Furthermore, the fast reverse recovery time of the MOS P-N junction Schottky diode device increases the switching speed thereof. By integrating the MOS structure and the P-N junction diode to the Schottky diode, the present invention can overcome the trade-off between low forward voltage drop and low reverse leakage current. Furthermore, the manufacturing method according to the present invention uses the fewest photo-resist layers to manufacture the MOS P-N junction Schottky diode device. Therefore, the manufacturing method is highly competitive.

While the invention has been described in terms of what is presently considered to be the most practical and preferred embodiments, it is to be understood that the invention needs not to be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A MOS P-N junction Schottky diode device, comprising:
    a substrate having a first conductivity type;
    a plurality of doped regions having a single second conductivity type formed in the substrate and each doped regions comprising a first doped sub-region and a second sub-region, wherein the first doped sub-region is formed by a first ion implantation and a second ion implantation and the second doped sub-region is formed by the second ion implantation, the first doped sub-region is adjacent to the second doped sub-region, both the first doped sub-region and the second doped sub-region are adjacent to a top plane surface of the substrate, and the first doped sub-region has a higher depth than the second doped sub-region, wherein said plurality of doped regions having said single second conductivity type only directly adjacent to an un-implanted region within the substrate having said first conductivity type;
    a field oxide structure formed and directly contacting on the top plane surface of the substrate;
    a plurality of gate structures formed on the top plane surface of the substrate, wherein each gate structure comprises a polysilicon layer;
    a top electrode formed and immediately adjacent and above the field oxide structure, the ploysilicon layers of the gate structures, the doped regions, and the top plane surface of the substrate; and
    a bottom electrode formed adjacent and below the substrate;
    wherein a plurality of ohmic contacts are formed between the top electrode and the doped regions, a plurality of Schottky contacts are formed between the top electrode and the substrate, one side of each of the gate structures is only adjacent to said second conductivity type to form the ohmic contacts, an opposite side of each of the gate structures is only adjacent to said first conductivity type to form the Schottky contacts, and such that said first conductivity type and said second conductivity type are alternated directly underneath said top electrode among said plurality of gate structures.

2. The MOS P-N junction Schottky diode device according to claim 1 wherein the substrate comprises a relatively heavily-doped N-type silicon layer and a relatively lightly-doped N-type epitaxial layer.

3. The MOS P-N junction Schottky diode device according to claim 2 wherein the plurality of doped sub-regions are doped with P-type dopants.

4. The MOS P-N junction Schottky diode device according to claim 1 wherein the gate structure includes a doped polysilicon layer.

5. The MOS P-N junction Schottky diode device according to claim 1, wherein each gate structure comprises a gate oxide layer between the polysilicon layer and the substrate.

6. The MOS P-N junction Schottky diode device according to claim 1 wherein the top electrode is made of one of aluminum or aluminum alloy, and the MOS P-N junction Schottky diode device further comprises an adhesion layer made of one of titanium and titanium nitride disposed between the top electrode and the substrate.

7. The MOS P-N junction Schottky diode device according to claim 1, further comprising a guard ring having the second conductivity type in the substrate adjacent to the field oxide structure.

8. The MOS P-N junction Schottky diode device according to claim 1, wherein the second doped sub-region disposed between the gate structure and the first doped sub-region.

9. A MOS P-N junction Schottky diode device, comprising:
   a substrate having a first conductivity type;
   a plurality of doped regions having a single second conductivity type formed in the substrate, wherein said plurality of doped regions having said single second conductivity type only directly adjacent to an un-implanted region within the substrate having said first conductivity type;
   a field oxide structure formed and directly contacting on the top plane surface of the substrate;
   a plurality of gate structures formed on the top plane surface of the substrate, wherein each gate structure comprises a polysilicon layer;
   a top electrode formed and immediately adjacent and above the field oxide structure, the ploysilicon layers of the gate structures, the doped regions, and the top plane surface of the substrate; and
   a bottom electrode formed adjacent and below the substrate;
   wherein a plurality of ohmic contacts are formed between the top electrode and the doped regions, a plurality of Schottky contacts are formed between the top electrode and the substrate, and one side of each of the gate structures is only adjacent to said second conductivity type to form the ohmic contacts, an opposite side of each of the gate structures is only adjacent to said first conductivity type to form the Schottky contacts, and such that said first conductivity type and said second conductivity type are alternated directly underneath said top electrode among said plurality of gate structures.

10. The MOS P-N junction Schottky diode device according to claim 9 wherein the substrate comprises a relatively heavily-doped N-type silicon layer and a relatively lightly-doped N-type epitaxial layer.

11. The MOS P-N junction Schottky diode device according to claim 9 wherein the plurality of doped regions are doped with P-type dopants.

12. The MOS P-N junction Schottky diode device according to claim 9 wherein the gate structure includes a doped polysilicon layer.

13. The MOS P-N junction Schottky diode device according to claim 9, wherein each gate structure comprises a gate oxide layer between the polysilicon layer and the substrate.

14. The MOS P-N junction Schottky diode device according to claim 9 wherein the top electrode is made of one of aluminum or aluminum alloy, and the MOS P-N junction Schottky diode device further comprises an adhesion layer made of one of titanium and titanium nitride disposed between the top electrode and the substrate.

15. The MOS P-N junction Schottky diode device according to claim 9, further comprising a guard ring having the second conductivity type in the substrate adjacent to the field oxide structure.

* * * * *